US010196734B2

(12) United States Patent
Ott et al.

(10) Patent No.: US 10,196,734 B2
(45) Date of Patent: Feb. 5, 2019

(54) NANOTWINNED SILVER ALLOY FILM WITH CONTROLLED ARCHITECTURE

(71) Applicant: Iowa State University Research Foundation, Inc., Ames, IA (US)

(72) Inventors: Ryan Timothy Ott, Ames, IA (US); Matthew Frank Besser, Urbandale, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 819 days.

(21) Appl. No.: 14/664,342

(22) Filed: Mar. 20, 2015

(65) Prior Publication Data

US 2015/0275350 A1    Oct. 1, 2015

Related U.S. Application Data

(60) Provisional application No. 61/970,276, filed on Mar. 25, 2014.

(51) Int. Cl.
| | |
|---|---|
| C23C 14/54 | (2006.01) |
| C23C 14/00 | (2006.01) |
| C23C 14/16 | (2006.01) |
| C23C 14/35 | (2006.01) |

(52) U.S. Cl.
CPC .......... C23C 14/165 (2013.01); C23C 14/352 (2013.01); C23C 14/541 (2013.01)

(58) Field of Classification Search
CPC .... C23C 14/165; C23C 14/352; C23C 14/541
See application file for complete search history.

(56) References Cited

U.S. PATENT DOCUMENTS

| | | | | |
|---|---|---|---|---|
| 3,427,154 A | * | 2/1969 | Mader | B22D 11/0611 148/304 |
| 2006/0243976 A1 | * | 11/2006 | Shin | H01L 27/3244 257/59 |
| 2011/0209986 A1 | * | 9/2011 | Kitada | B82Y 25/00 204/192.15 |

OTHER PUBLICATIONS

Zhang et al., "Enhanced hardening in Cu/330 stainless steel multilayers by nanoscale twinning," Acta Materialia, vol. 52, Oct. 22, 2003, pp. 995-1002, www.actamat-journals.com.
You et al., "Plastic anisotropy and associated deformation mechanisms in nanotwinned metals," Acta Materialia, vol. 61, Elsevier Ltd., Oct. 17, 2012, pp. 217-227, www.elsevier.com/locate/actamat.
Wang et al., "Defective twin boundaries in nanotwinned metals," Nature Materials, vol. 12, Macmillan Publishers Limited, May 19, 2013, pp. 697-702, www.nature.com/naturematerials.

(Continued)

*Primary Examiner* — John J Brayton
(74) *Attorney, Agent, or Firm* — Shumaker & Sieffert, P.A.

(57) ABSTRACT

A technique for forming a material including nanotwinned silver crystals in solid solution with a solute that exhibits enhanced strength and desirable electrical conductivity, as compared to coarse-grained material. Synthesis of nanotwinned silver alloy material is achieved by cooling of a substrate and co-deposition of silver and the solute. Controlling the processing conditions of synthesis allows for tailoring of the nanostructure and mechanical properties of the nanotwinned silver alloy material. A material including nanotwinned silver crystals in solid solution with a solute also is described.

12 Claims, 18 Drawing Sheets

(56) References Cited

OTHER PUBLICATIONS

Lu et al., "Revealing the Maximum Strength in Nanotwinned Copper," Science, vol. 323, www.sciencemag.org, Jan. 30, 2009, pp. 607-610.
Bufford et al., "High strength, epitaxial nanotwinned Ag films," Acta Materialia, vol. 59, Elsevier Ltd., Sep. 5, 2010, pp. 93-101, www.elsevier.com/locate/actamat.

\* cited by examiner

NANOTWINNED SILVER ALLOY FILM WITH CONTROLLED ARCHITECTURE

This application claims the benefit of U.S. Provisional Patent Application No. 61/970,276, filed Mar. 25, 2014, and titled, "NANOTWINNED SILVER ALLOY FILM WITH CONTROLLED ARCHITECTURE," the entire content of which is incorporated herein by reference.

STATEMENT OF GOVERNMENT INTEREST

This invention was made with Government support from a grant under Contract No. DE-AC02-07CH11358, provided by the U.S. Department of Energy, Office of Basic Energy Sciences, Division of Materials Sciences and Engineering. The Government may have certain rights in the invention.

TECHNICAL FIELD

The disclosure relates to techniques for depositing source materials on a substrate to form a material including crystals with twinned boundaries. Materials including such features and formed by such techniques also are disclosed.

BACKGROUND

A material with a low stacking fault energy (SFE) can form a twin boundary, for example, a nanoscale twin or nanotwinned (nt) boundary, when synthesized via physical vapor deposition (e.g., magnetron sputtering) or electrodeposition. The presence of nt boundaries may strengthen a material relative to a coarse-grained material. Unlike some nanocrystalline metals, nt metals may exhibit large, uniform tensile ductility.

SUMMARY

Nanotwinned metals may present a desirable combination of strength and conductive properties, as compared to their coarse-grained and nanocrystalline metal counterparts. In this disclosure, techniques including cooling a substrate and co-depositing silver (Ag) and a solute (e.g., copper (Cu)) in solid solution on the cooled substrate have been used to synthesize materials (e.g., films) with architectures that enhance desired mechanical properties of the materials. Cooling of the substrate, twin boundary spacing, and the volume fractions of certain Ag phases in the material, among other factors, may improve the strength and conductivity of the materials, among other properties. The architectures of such Ag alloy films may include crystals having nanotwinned boundaries with spacings ranging from, for example, 3 to 70 nanometers (nm). As described herein, controlling the processing conditions before and during synthesis of a nt Ag alloy material allows for tailoring of the nanostructure of a film of the material over a single substrate, and thus, tailoring of desired mechanical properties of the nt Ag alloy film.

In one aspect, the present disclosure is directed to a method including cooling a substrate; and co-depositing silver (Ag) and a solute on the cooled substrate to form a material including a plurality of Ag crystals in solid solution with the solute, wherein a twinned boundary between at least two Ag crystals has a spacing of between about 3 and about 70 nanometers (nm).

In another aspect, the present disclosure is directed to a material including a plurality of silver (Ag) crystals in solid solution with a solute selected from the group consisting of copper, iron, palladium, gold, aluminum, and combinations thereof, and wherein a twinned boundary between at least two Ag crystals has a spacing of between about 3 and about 70 nanometers (nm).

The details of one or more examples are set forth in the accompanying drawings and the description below. Other features, objects, and advantages will be apparent from the description and drawings, and from the claims.

DETAILED DESCRIPTION

Figure 1:
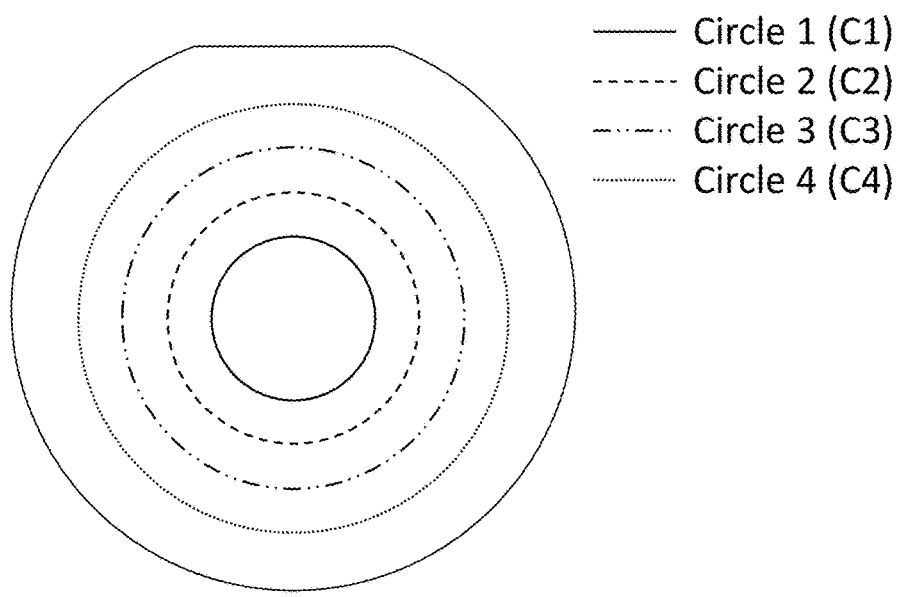
FIG. 1 is a schematic drawing representing a top view of an example substrate.

The present disclosure describes the synthesis of nanotwinned Ag alloy materials that present enhanced mechanical properties, including, for example, improved strength while maintaining comparable electrical conductivity, as compared to coarse-grained metal materials. The disclosure describes controlling the processing conditions before and during synthesis of a nt Ag alloy material to tailor of the nanostructure of the material, and thus tailor desired mechanical properties of the material. Disclosed techniques include cooling a substrate and co-depositing Ag and a solute on the cooled substrate to form a material including a plurality of Ag crystals in solid solution with the solute, where a twinned boundary between at least two Ag crystals has a spacing of between about 3 nm and about 70 nm. Controlling the architecture of the material can enhance desired mechanical properties of the material, such as strength and electrical conductivity. In some examples, the disclosed technique includes cooling a substrate (e.g., a silicon wafer), then magnetron sputtering on to the single cooled silicon wafer Ag and a Cu solute from source targets within a single chamber, to form a film on the silicon wafer that includes a plurality of Ag crystals in solid solution with Cu, where twinned boundaries formed between certain Ag crystals have a spacing of between about 3 nm and about 70 nm. Thus, said at least two Ag crystals are in the range of about 3 nm to about 70 nm apart along the twinned boundary. Cooling of the substrate, twin boundary spacing, and the volume fractions of certain Ag phases in the nt Ag alloy material, among other factors, may improve the strength of the material, among other properties, while improving or maintaining comparable electrical conductivity, as compared to coarse-grained metals.

The nanotwinned Ag alloys described in this disclosure include face-centered cubic (fcc) Ag crystals, and may also include other non-fcc Ag phases, including, for example, a metastable phase consistent with a 4-hexagonal (4-H) phase. The nt Ag alloy material formed by the techniques described herein may include Ag crystals in a solid solution with one or more solutes, for example Cu. The twin boundary spacing, crystal (or grain) size, texture of the grains, and the volume fraction of one or more metastable phases can be controlled by modifying processing conditions. These processing conditions may include, for example, the deposition rate of the Ag and/or solute, deposition pressure, and deposition time, the rate of formation of the material on the substrate, the substrate type, the temperature of the substrate, and the identity of one or more added solutes, among other factors. Alloying elements or solutes that may be added to the Ag films may be, for example, transition metals (such as, Cu, iron (Fe), palladium (Pd), and/or gold (Au)) and/or metalloids (such as aluminum (Al)). Such alloying elements or solutes typically may constitute less than 10 atomic percent (at. %) of the film, for example, 0.3 at. % of the film. The choice of solute added to Ag may affect the grain size and texture of the nanotwinned material.

Film architectures of the material can be synthesized to exhibit, for example, columnar grains with strong (111) texture normal to the growth direction of the columnar grains, or weak texture with more equiaxed-shaped grains. Further, as discussed in this disclosure, the volume fraction of the metastable non-fcc Ag phase (for example, a 4-H Ag phase) in the films can be controlled. By varying different structural parameters, the strength, ductility, and electrical conductivity of the material also can be tailored. Moreover, architectures of the Ag alloy materials can exhibit very high strengths (greater than 500 mega-Pascals (MPa)) under quasi-static uniaxial tension, along with electrical conductivities that are comparable to pure nanocrsytalline Ag. The nanotwinned Ag alloy materials of this disclosure also present desirable thermal stability, as compared to pure coarse-grained metals. Thicknesses of the nt Ag alloy films synthesized by the techniques of this disclosure can range from, for example, 0.010 microns to 200 microns (or greater) in thickness, measured in a direction that is substantially normal to the substrate on which the material is deposited. A continuous film may be deposited on, for example, a 6-inch silicon wafer substrate, in which the architecture and mechanical properties of the film can be tailored in a single deposition run.

The disclosed techniques provide for the synthesis of nt Ag alloy films that exhibit high strengths, along with desirable transport properties (e.g., electrical conductivity). Films possessing such properties may be well suited in application to, for example, flexible displays interconnects, where high film conductivity may be required, along with high film strength to prevent, for instance, premature failure due to repeated mechanical loading. Typically, the properties of strength and conductivity in films are inversely related, since mechanisms that lead to strengthening often inhibit electron transport. However, the nt Ag alloy of this disclosure presents, among other features, high strength along with high conductivity, a combination which may be desirable in a variety of electronics applications.

The structure of an nt Ag film deposited on a substrate (for example, a silicon wafer) can be varied across the substrate. For an nt Ag film deposited on a rotating substrate by magnetron sputtering in a confocal geometry, the portion of the film at the center of the substrate may display higher strength and lower ductility, as compared to portions of the film a farther radial distance away from the center of the substrate. In this example, the center of the film represents the point of highest deposition rate of Ag and the solute. The center of the film in this example also may represent the highest fraction of a metastable Ag phase (e.g., the 4-H Ag phase) in a structure. The substrate, as described by this disclosure, may be for example, silicon, amorphous carbon, steel, tantalum (Ta), copper (Cu), ceramic, glass, or polymer.

In some examples, the addition of a Cu solute in forming the nt Ag film may decrease the average grain size in the film. For example, a Cu solute may be deposited by magnetron sputtering a Cu source while sputtering a Ag source in the same chamber. Adding a Cu solute to a film may enhance the strength but decrease the tensile ductility of the deposited film.

Metals having crystals with twin boundaries, for example nanotwinned metals, may exhibit high strength and large, uniform tensile ductility, as compared to nanocrystalline metals without twin boundaries. The strength and ductility of an nt metal can depend on its crystalline structure, the makeup of which can be controlled during synthesis of the nt metal by controlling (among other factors) the deposition rate of the metal and/or a solute on a substrate, cooling of the substrate, and the addition of solutes. By designing specific crystalline structures of nt metals in this manner, plasticity mechanisms of the nt metal can be modified to control the bulk mechanical response of the nt metal. In this disclosure, real-time synchrotron x-ray scattering, coupled with bulk mechanical testing, and nano-indentation have been utilized to study the deformation behavior of nt Ag synthesized by magnetron sputtering. Plasticity mechanisms of nt Ag and nt Ag alloys have been examined for different structures of the same materials.

In some examples, the structure of an nt-Ag alloy film deposited on a substrate (for example, a silicon wafer), and thus mechanical properties of the film, can be varied across the substrate. An example nt-Ag alloy film may be deposited by physical vapor deposition (e.g., magnetron sputtering) in a confocal geometry, the portion of the film at the center of the substrate displaying high strength and low ductility, as compared to portions of the film farther from the center of the film. The center of the film may represent the point of highest deposition rate during, for example, magnetron sputtering in a confocal geometry as noted. The center of such a film also may represent the highest fraction of a non-fcc Ag phase (e.g., a 4-H Ag phase) in the film.

An example technique of this disclosure includes cooling a substrate by, for example, exposing it to liquid nitrogen for at least 30 minutes (for example, for 45 minutes), then magnetron sputtering (or, for example, electrodeposition) one or more Ag and solute targets with a suitable gas or ions (for example, with Argon gas) to synthesize a Ag alloy film architecture. The nanostructure of such a film may be designed over a single substrate to tailor the mechanical properties of the film. The Ag alloy films of this disclosure may have an architecture including a nanotwinned Ag alloy film, where nanotwin boundary spacings range from, for example, 3 to 70 nanometers (nm). As mentioned, the nt Ag alloy material also may include a non-fcc Ag phase (e.g., a 4-H Ag phase). As with the twin boundary spacing, the grain size, texture of the grains, and the volume fraction of the metastable, non-fcc phase can be controlled via the processing conditions. These processing conditions include the deposition rate, the substrate type, the substrate temperature, the alloying additions, deposition pressure, and deposition time, among others. The addition of, for example, a Cu solute in solid solution with to the nt-Ag crystals may decrease the average grain size and tensile ductility of the film, while increasing the strength of the film.

Materials described by and formed by the techniques of this disclosure, e.g., nt-Ag crystals and nt-Ag alloy crystals including twinned boundaries between crystals with spacings between about 3 nm and about 70 nm, may define shapes having certain thicknesses. This thickness of the material, as referenced, is measured in a direction substantially normal to any substrate on which the materials may be deposited or co-deposited. For example, a thin film material may form a circular shape on a silicon wafer substrate, wherein the material has a thickness of at least 30 microns. Other three-dimensional shapes of material are likewise contemplated by this disclosure. The disclosure also describes an apparatus configured to perform the techniques disclosed herein, materials that may be formed by the techniques described in this disclosure, and materials including twinned crystals and nanostructures that exhibit enhanced or desired properties, including strength, electrical conductivity, and thermal stability.

EXAMPLES

A first sample consisting of a representative free-standing, pure nt-Ag film having a thickness of at least 30 microns (measured in a direction substantially normal to the substrate on which the film is deposited) was synthesized by magnetron sputtering Ag on to a liquid nitrogen cooled, six-inch (100) silicon (Si) wafer substrate. The silicon wafer was cooled by exposure to liquid nitrogen for about 30 minutes prior to the start of sputtering. Three 2-inch guns (cathodes) of the magnetron sputtering apparatus were arranged in a confocal geometry, focused on the center of the substrate. Arranging the guns in this manner produced a rate of deposition of Ag on the substrate that has a radial dependence, with the highest rate of deposition occurring at the center of the substrate. FIG. 1 is a schematic drawing representing a top view of an example substrate (e.g., a silicon wafer) on which Ag, or Ag and one or more solutes, may be deposited, for example, by magnetron sputtering in a confocal geometry. Circle 1 (C1), as shown at FIG. 1, represents a first radial distance from the center of the film or substrate, Circle 2 (C2) a second radial distance farther from the center of the film or substrate than C1, Circle 3 (C3) a third radial distance farther from center than C2, and Circle 4 (C4) a fourth radial distance farther from center than C3. Circles 1 to 4 of FIG. 1 represent sample film positions that correspond to different deposition rates.

Figure 2:
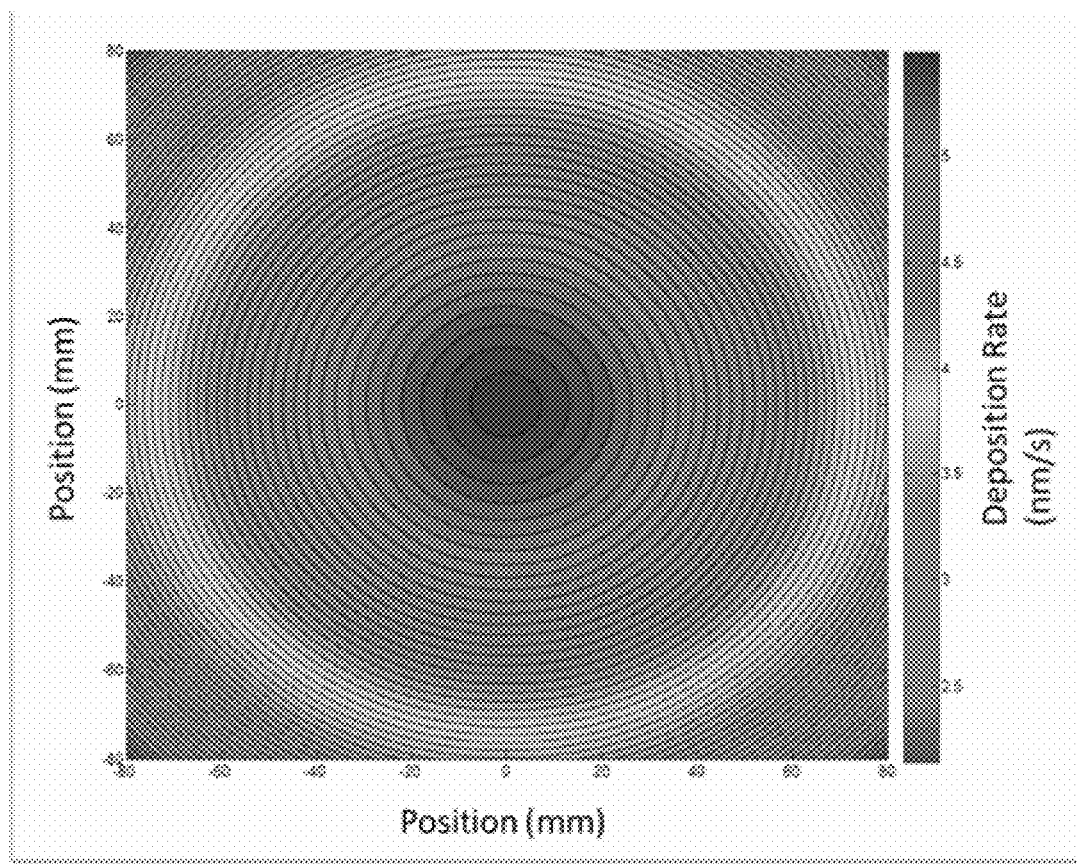
FIG. 2 is a plot illustrating representative rates of deposition of an example nt-Ag alloy film on a substrate.

FIG. 2 is a chart illustrating representative rates of deposition of example nt-Ag or nt Ag alloy films on a substrate, for example, rates of deposition on a silicon wafer by magnetron sputtering with guns of the apparatus arranged in a confocal geometry. As shown in FIG. 2, the deposition rate of the material, measured in nanometers per second (s), is highest at the center of the substrate, then decreases as the radial distance from the center of the substrate increases. The center of the substrate in FIG. 2 is the point where the x and y axes both equal zero millimeters (mm). For example, in reference to FIG. 2, and like the example substrate of FIG. 1, the deposition rate of the material of an exemplary nt-Ag alloy film (e.g., a nt-Ag in solid solution with 0.3 at. % Cu) measured at a radial distance of 20 millimeters (mm) from the center of the wafer would be higher than the deposition rate of the same material at a radial distance of 40 mm from the center of the wafer. In some examples, the rate of deposition of Ag may correspond to a first rate of deposition, and a rate of deposition of a solute may correspond to a different, second rate of deposition. For example, the rate of deposition of Ag may be faster than the rate of deposition of the solute. In some examples, formation of the material on a substrate may be, for example, at least about 1.5 nm/second (e.g., 5 nm/second).

A second sample consisting of a representative nt-Ag alloy film was synthesized by magnetron sputtering Ag and Cu on to a liquid nitrogen cooled, six-inch (100) silicon (Si) wafer substrate. The silicon wafer was cooled by exposure to liquid nitrogen for about 45 minutes prior to the start of sputtering. Four guns of the magnetron sputtering apparatus were arranged in a confocal geometry, focused on the center of the substrate, with three 2-inch guns sputtering Ag and one 3-inch gun sputtering Cu. The guns (cathodes) containing Ag targets were set at a power of 300 watts (W). The value of the absolute pressure of the vacuum chamber of the magnetron sputtering apparatus before sputtering was $9 \times 10^{-9}$ Torr, while the pressure of the Argon gas discharged from the guns (cathodes) was 5 milli-Torr. The substrate was rotated at 15 rotations per minute during sputtering. Arranging the guns in this manner and rotating the substrate produced a rate of deposition of material (e.g., Ag crystals in solid solution with the Cu solute) on the wafer that has a radial dependence, with the highest rate of deposition occurring at the center of the wafer. The Ag and Cu targets were sputtered for about 2 hours with respect to the second sample. In some examples, shorter or longer sputtering times may be utilized. Additionally, according to this disclosure, guns of a magnetron sputtering apparatus containing solute targets (e.g., Cu) may be set at a range of powers, for example, between about 20 W and about 100 W (e.g., between about 20 W and about 60 W). For an nt-Ag alloy film including 0.3 at. % Cu, a power of about 20 W may be utilized, although other powers may be used depending on the deposition conditions. Further, in some examples, the pressure of gas (e.g., Argon gas) discharged from the guns (cathodes) may range from, for example, about 1 to about 50 milli-Torr. Additionally, the cathodes of a magnetron sputtering apparatus may be set to a power of about 20 to 200 W/square inch, taking in to account, for example, whether a 2-inch or 3-inch cathode/gun is being utilized.

Figure 3A:
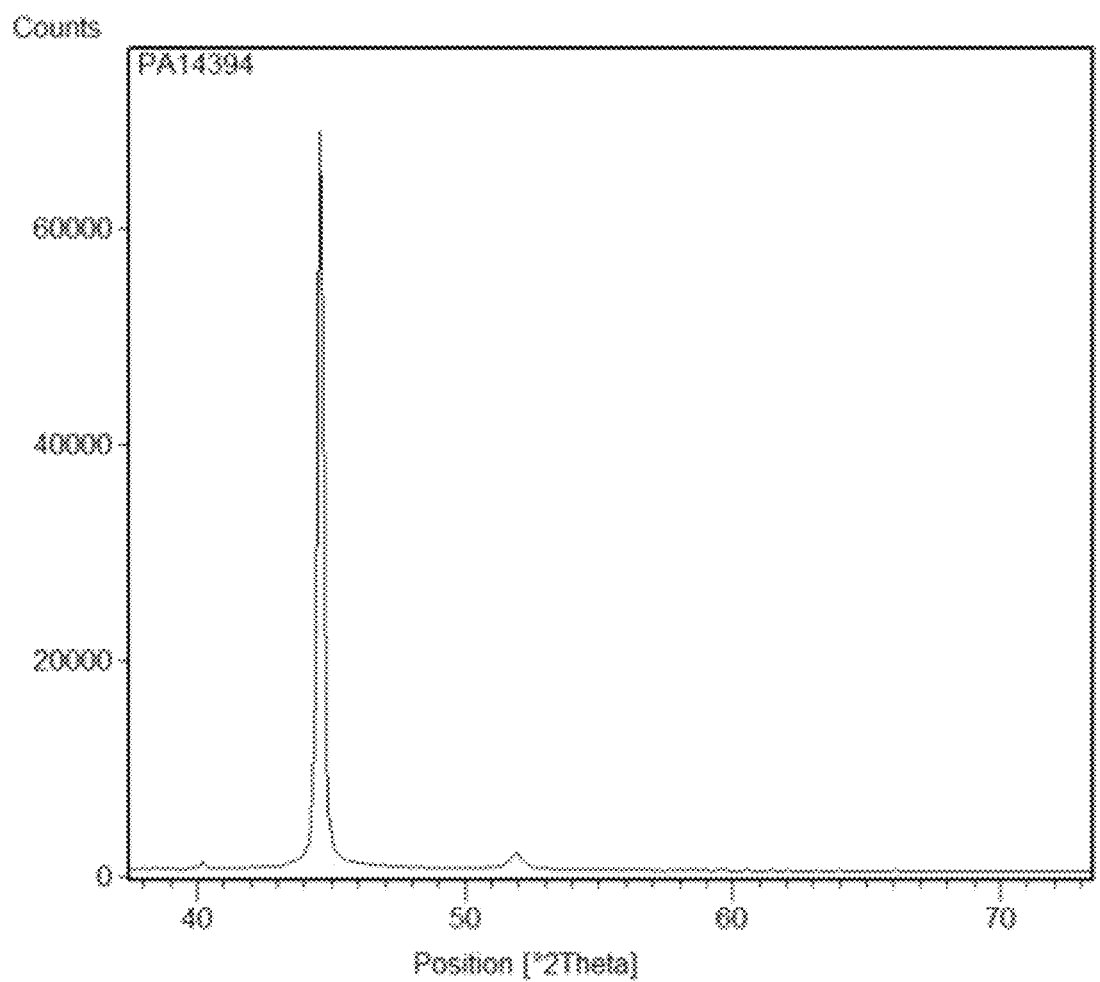
FIG. 3A is a plot presenting a representative x-ray diffraction curve of an exemplary nt-Ag alloy film including a 0.3 at. % Cu solute.
Figure 3B:
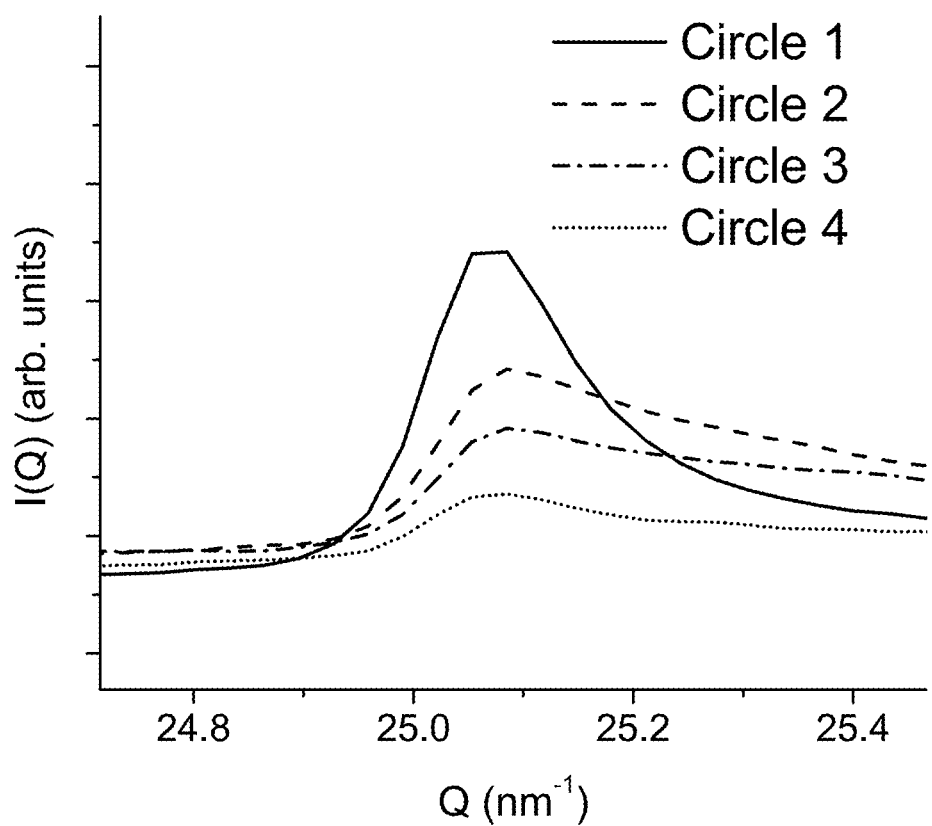
FIG. 3B is a plot presenting representative x-ray diffraction curves of a sample of pure nt-Ag film.

FIG. 3A is a chart presenting a representative x-ray diffraction curve of a second sample, i.e., an exemplary nt-Ag alloy film including a 0.3 at. % Cu solute. In this example, the atomic percentage of Cu in the second sample was measured by wavelength dispersion spectrometry. The XRD pattern shows the strong (111) texturing of the second sample. FIG. 3B is a chart presenting representative x-ray diffraction curves of a sample of pure nt-Ag film. The chart illustrates the variation of a volume fraction of a non-fcc, 4-H Ag phase in the film, measured along the diameter of the silicon wafer on which the example film was deposited. The four curves correspond to portions of the film measured at radial distances C1, C2, C3 and C4, as described in FIG. 1. For example, each of the curves displays a highest peak at approximately the center of the diameter of the wafer, representing a highest volume fraction of a 4-H Ag phase in the film. As demonstrated, the volume fraction of the 4-H Ag phase in the film varies along the diameter of the wafer.

X-ray diffraction scans of both the first sample (pure nt-Ag film) and the second sample (nt-Ag alloy film including 0.3 at. % Cu) showed an fcc Ag phase and a non-fcc Ag phase, but neither sample showed a Cu phase. The phase observed at FIG. 3B is consistent with a 4-hexagonal Ag phase. The referenced 4-H Ag phase measured in FIG. 3B with respect to the first sample also was determined to be present in the nt-Ag alloy film including 0.3 at. % Cu solute.

Figure 4A:
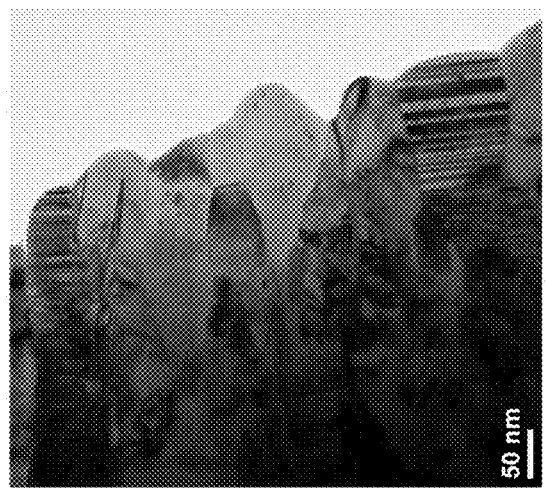
FIGS. 4A-4C are cross-sectional transmission electron microscopy (TEM) images of different regions of an exemplary pure nt-Ag film deposited on a substrate, measured along a first radial distance from the center of the substrate.
Figure 4B:
Figure 4C:
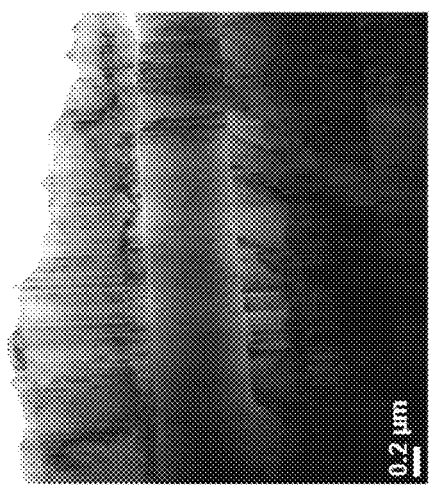

FIGS. 4A-4C show cross-sectional transmission electron microscopy (TEM) images of different regions of an exemplary pure nt-Ag film deposited on a substrate, i.e., the first sample, measured along a first radial distance (C1) from the center of the substrate. With respect to FIGS. 4A-4C, C1 was a distance of about 16 mm from the center of a six-inch silicon wafer. FIG. 4A is a cross-sectional TEM image of the bottom of the first sample, i.e., the region closest to the substrate, showing primarily equiaxed-shaped grains (see Table 1 below) FIG. 4B is a cross-sectional TEM image of the middle of the pure nt-Ag film, where grains formed primarily in a columnar shape. FIG. 4C is a cross-sectional TEM image of the top of the nt-Ag film, also showing columnar-shaped grains. As shown at FIGS. 4A-4C and Table 1, the structure of a nt-Ag film formed by the techniques of this disclosure may vary depending on the region of the film. Further, twinned crystals appear in FIGS. 4A-4C as horizontal lines normal to the direction of growth of the crystals. Likewise, as further set forth in Table 1, the size of the Ag crystals (or grains) may vary depending on the region of the film analyzed. For example, the crystals formed at the beginning of the sputtering process may be smaller and grow in an equiaxed structure (see FIG. 4A), while crystals formed in the middle or end of the process may be columnar in structure (see FIGS. 4B and 4C).

Figure 5A:
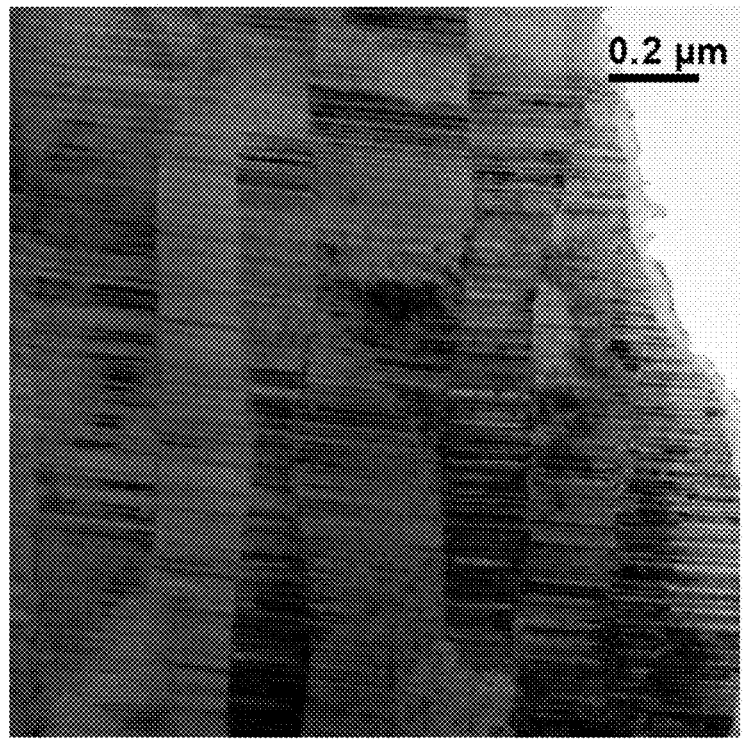
FIGS. 5A and 5B are cross-sectional TEM images of different regions of an exemplary nt-Ag alloy film including a 0.3 at. % Cu solute, measured at a first radial distance from the center of the substrate.
Figure 5B:
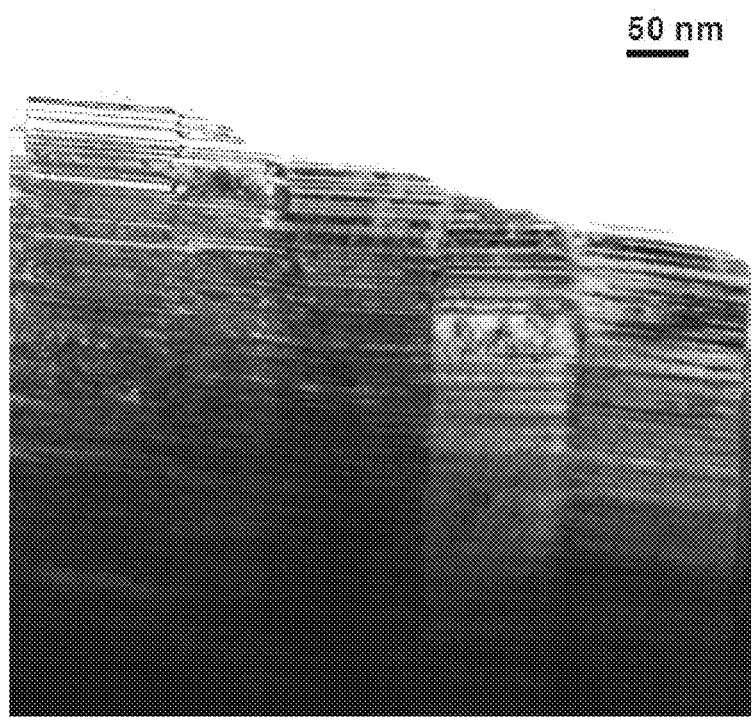

FIGS. 5A and 5B are cross-sectional TEM images of different regions of an exemplary nt-Ag alloy film including a 0.3 at. % Cu solute, measured along a first radial distance from the center of the substrate. In particular, FIGS. 5A and 5B show TEM images of the second sample measured at C1, a distance of about 16 mm from the center of a silicon wafer substrate. As with respect to the pure nt-Ag first sample, twinned crystals in the nt-Ag alloy second sample appear in FIGS. 5A and 5B as horizontal lines normal to the direction of growth of the crystals. FIG. 5A shows columnar-shaped grains formed at the middle region of the nt-Ag alloy film with 0.3 at. % Cu solute. FIG. 5B shows equiaxed-shaped grains formed at the bottom region of the film (see also Table 1).

TABLE 1

|  | Circle 1 | | | Circle 4 | | |
| --- | --- | --- | --- | --- | --- | --- |
|  | Bottom | Middle | Top | Bottom | Middle | Top |
| Structure of nt-Ag film | Equiaxed | Columnar | Columnar | Equiaxed | Columnar | Columnar |
| Structure of nt-Ag 0.3 at. % Cu film | Equiaxed | Columnar | — | — | — | — |
| Grain size (nm) of nt-Ag film | 150 | 350 | 500 | 150 | 350 | 400 |
| Grain size (nm) of nt-Ag + 0.3 at. % Cu film | 80 | 220 | 350 | — | — | — |
| TB spacing (nm) of nt-Ag film | 6-7 | 4-5 | 4-5 | 7-8 | 4-5 | 4-5 |
| TB spacing (nm) of nt-Ag + 0.3 at. % Cu film | 6-7 | 4-5 | 4-5 | — | — | — |
| Texture of nt-Ag film | {111} | {111} | {111} | Random | {111} | {111} |
| Texture of nt-Ag 0.3 at. % film | {111} | {111} | {111} | — | — | — |

As noted, Table 1 presents measurements of the structure, size, twin boundary spacing, and texture of the crystals of the first and second samples. As shown, the primary structure of at least a pure nt-Ag film formed according to the techniques of this disclosure may vary across a single substrate, for example, according to the region of the film analyzed. As further shown, the average grain size of the silver crystals of both the pure nt-Ag and nt-Ag alloy films may increase during the deposition process, for example and without limitation, from about 150 nm to about 500 nm for an exemplary nt-Ag film, and from about 30 nm to about 350 nm for an exemplary nt-Ag alloy film. As demonstrated, addition of a solute, e.g., Cu, to the Ag crystalline structure may significantly decrease the average grain size in films, and lead to enhanced strength of the film, as shown further at FIGS. 8A and 8B. The grain size of pure nt-Ag crystals, and of nt-Ag alloy crystals, also may depend on the film thickness.

The figures of Table 1 also show that twin boundary spacing can vary depending on the region of the film analyzed, for example, the bottom of the film as compared to the middle or top of the film. However, addition of a solute to the Ag deposited to form a film may not affect the twin boundary spacing of the Ag crystalline matrix. Twin boundary spacing of the nt-Ag allow films of this disclosure may range from, for example, about 3 nm to about 70 nm, measured by TEM. For example, as shown in Table 1, twin boundary spacing of a pure nt-Ag film may vary between about 3 nm and about 8 nm, and twin boundary spacing of a nt-Ag alloy film also may vary between about 3 nm and about 8 nm, depending on processing conditions as discussed herein. Moreover, the texture of the nt-Ag and nt-Ag alloy films of was measured to be primarily (111) as shown, with columnar grains showing a strong (111) texture normal to the growth direction of the columnar grains, and with equiaxed-shaped grains showing a weaker (111) texture. Characteristics of the nt-Ag and nt-Ag alloy films of Table 1 were measured at the C1 point on their respective silicon wafers, representing a radial distance of about 16 mm from the center point of their respective wafers. Characteristics also were measured for the pure nt-Ag film at the C4 point on the wafer at a radial distance of about 49 mm from the center point of the substrate, as shown.

Figure 6A:
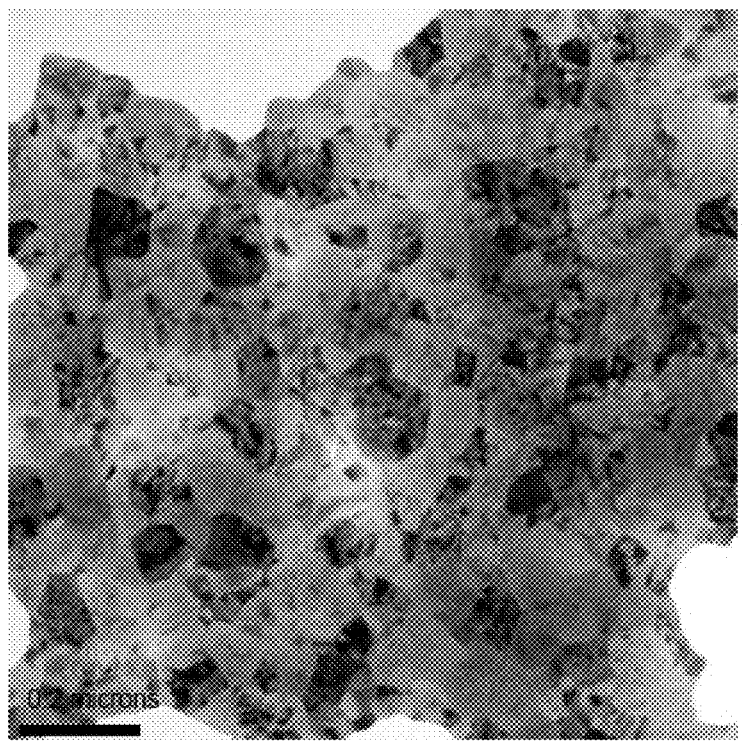
FIGS. 6A-6T are TEM images of a top view of exemplary pure nt-Ag and nt-Ag alloy films.
Figure 6B:
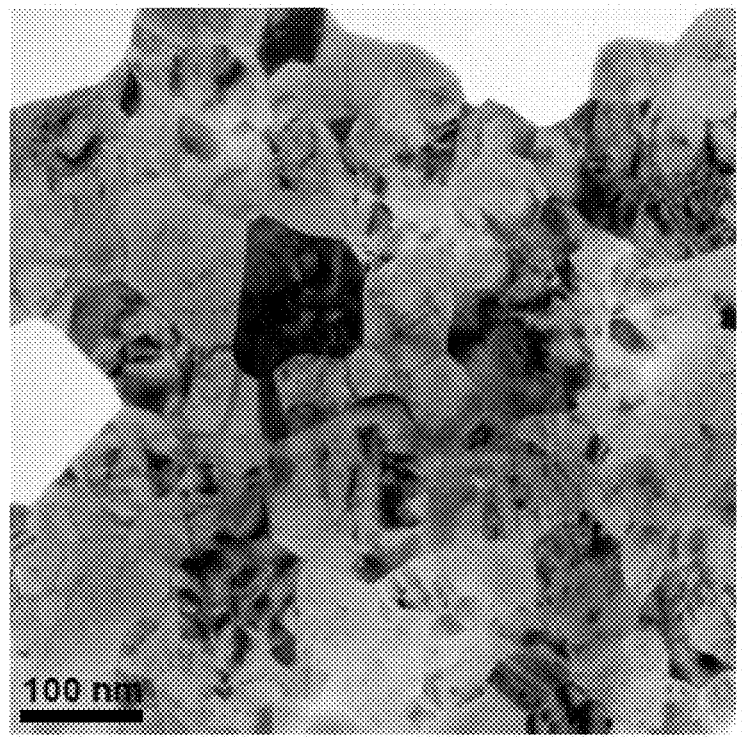
Figure 6C:
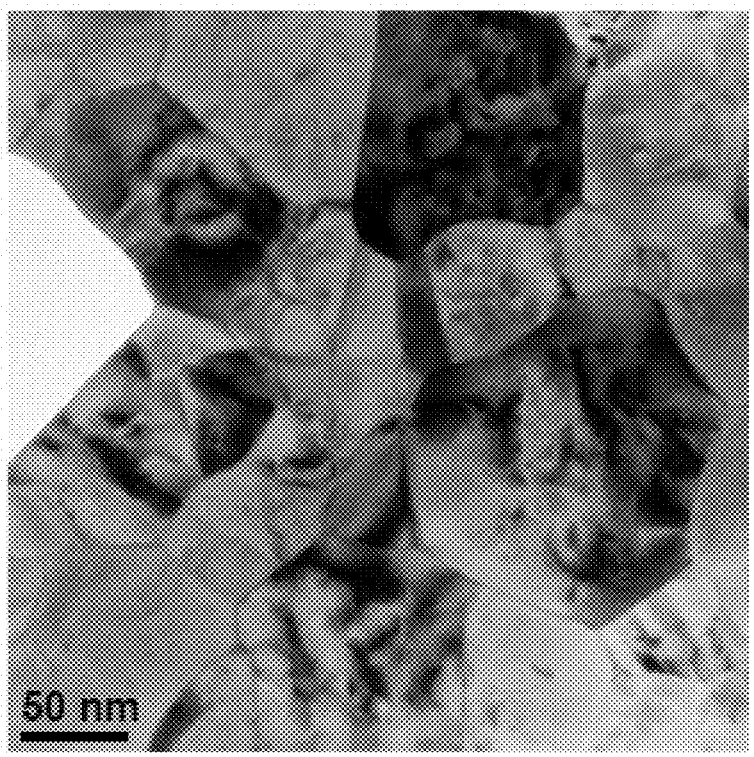
Figure 6D:
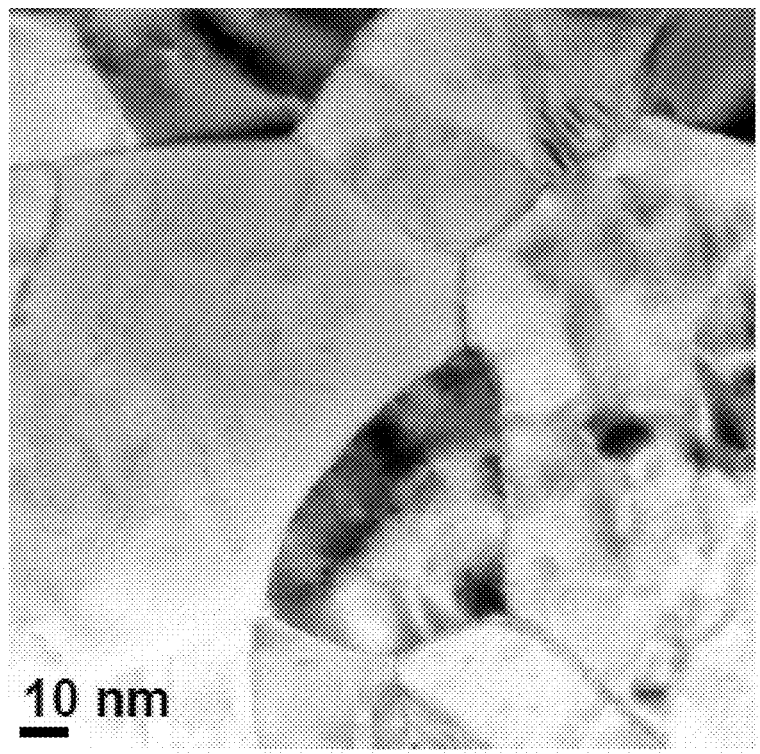
Figure 6E:
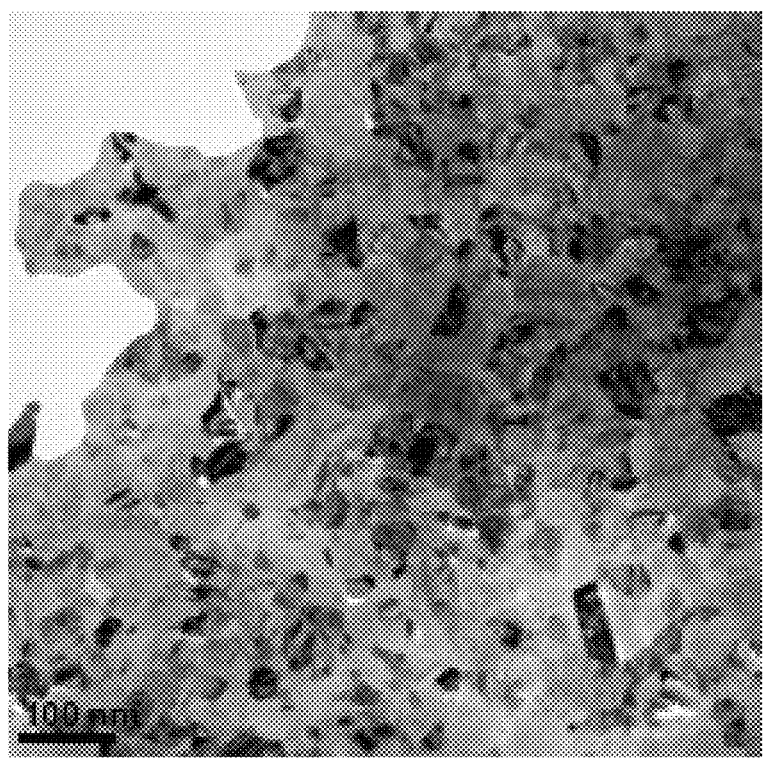
Figure 6F:
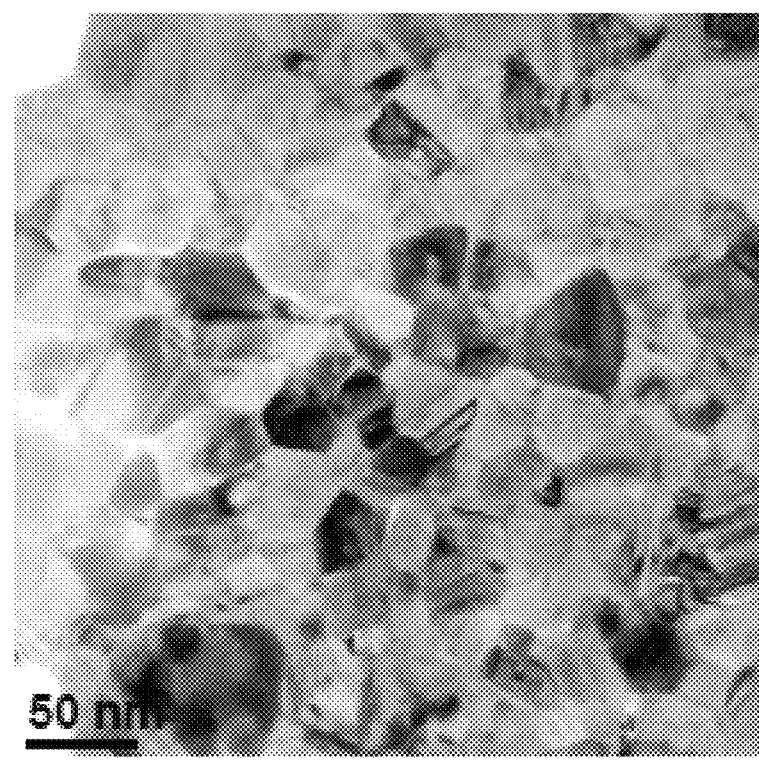
Figure 6G:
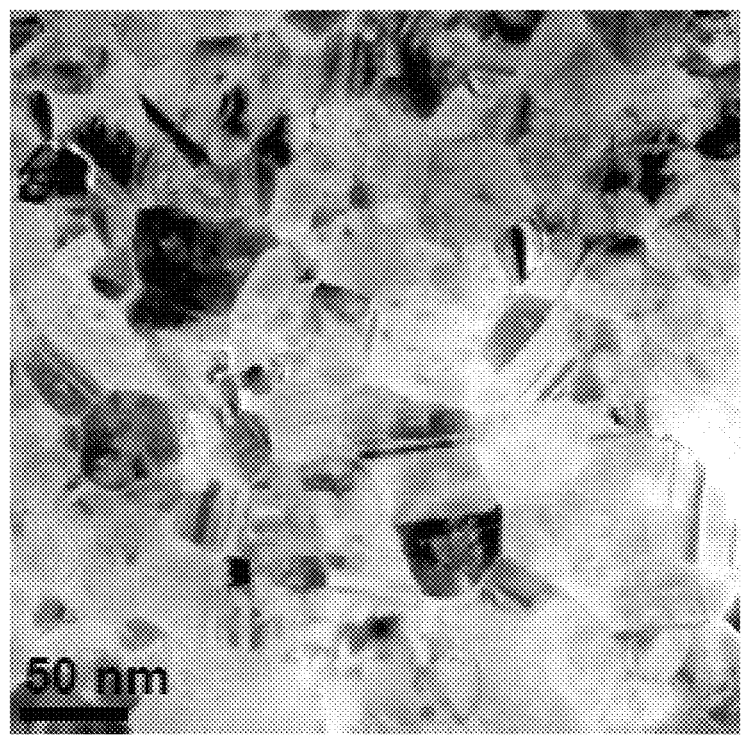
Figure 6H:
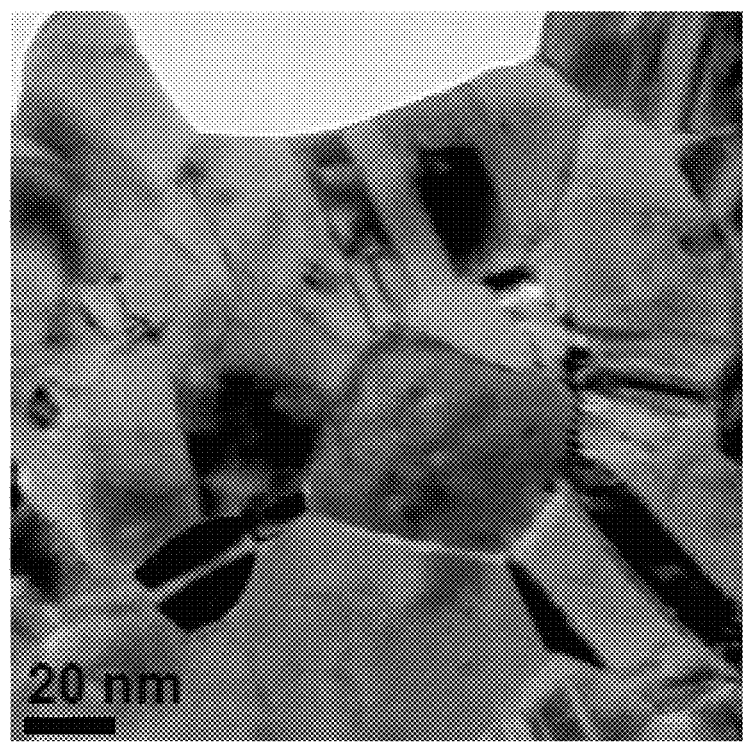
Figure 6I:
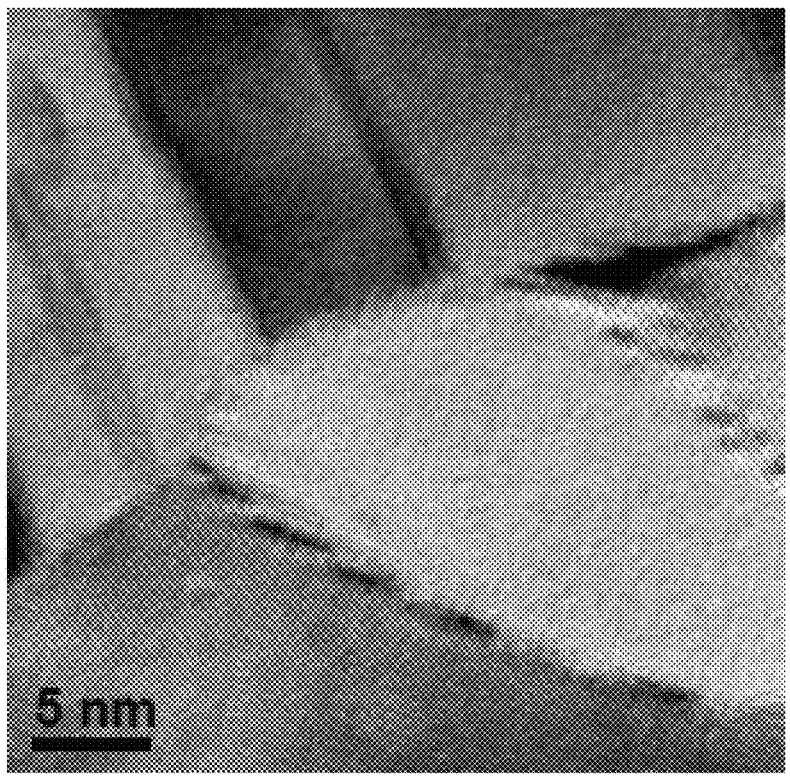
Figure 6J:
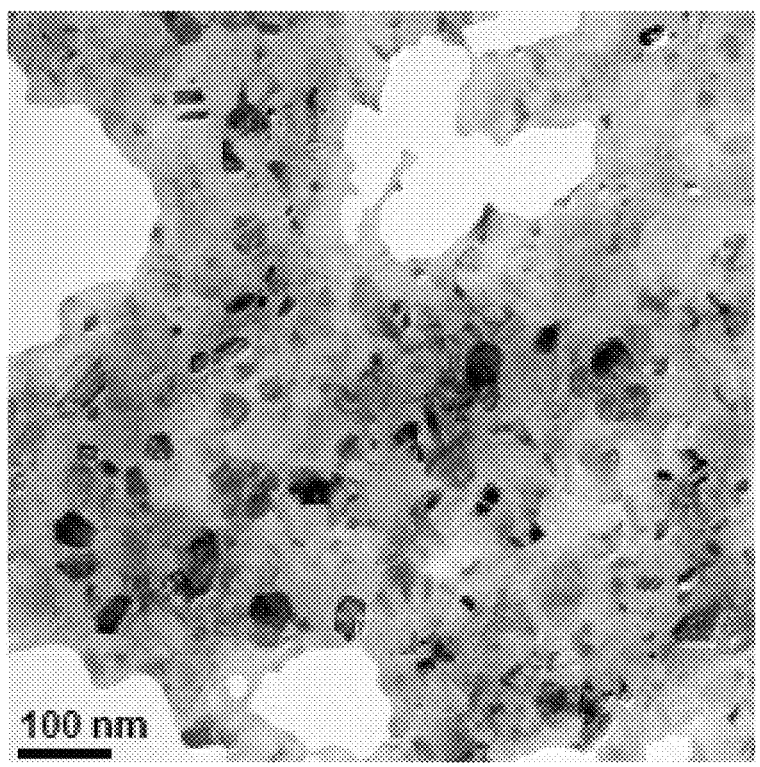
Figure 6K:
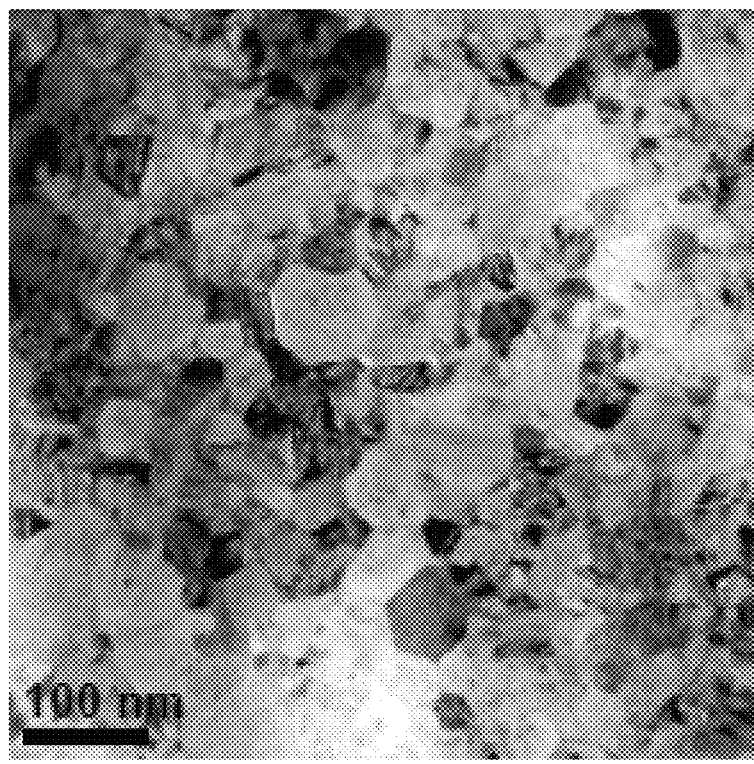
Figure 6L:
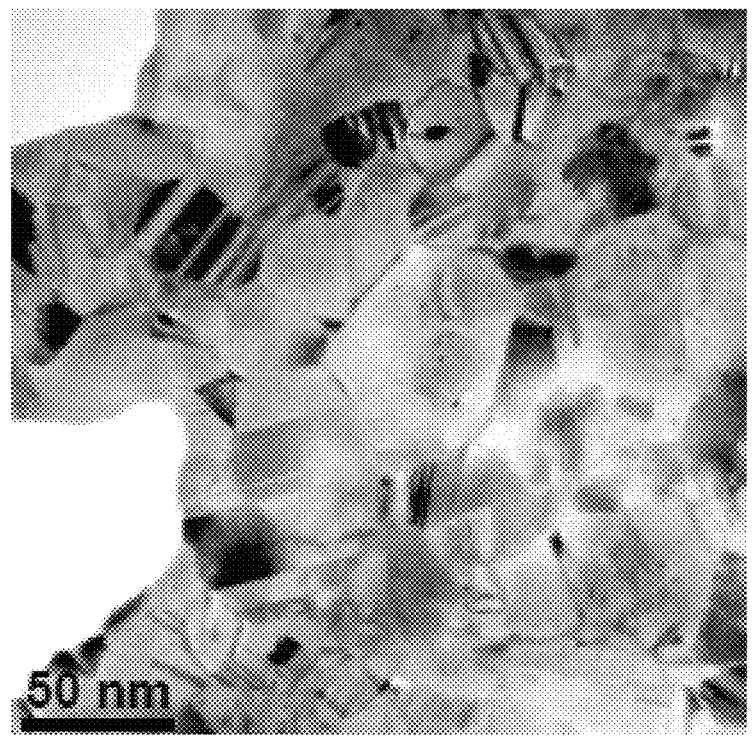
Figure 6M:
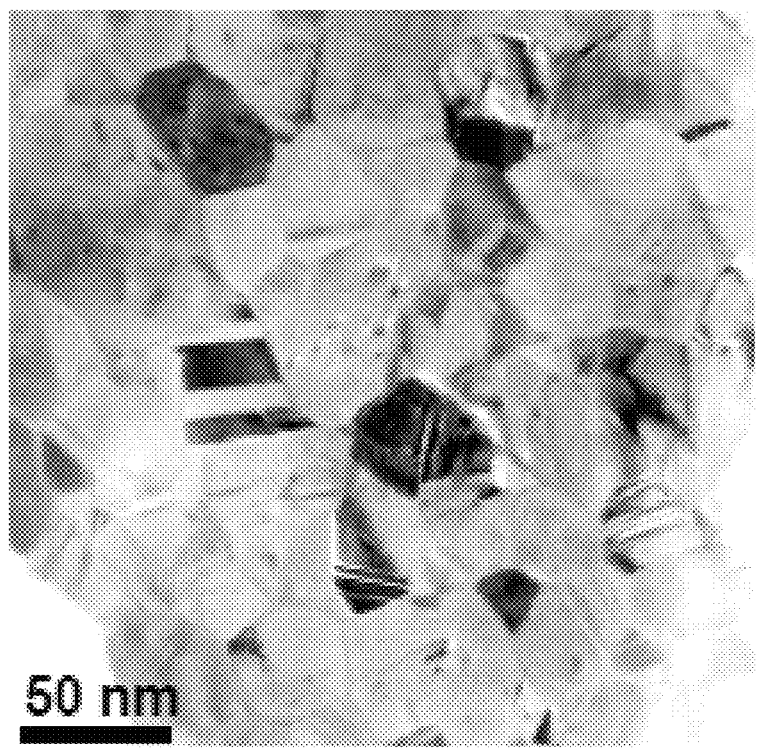
Figure 6N:
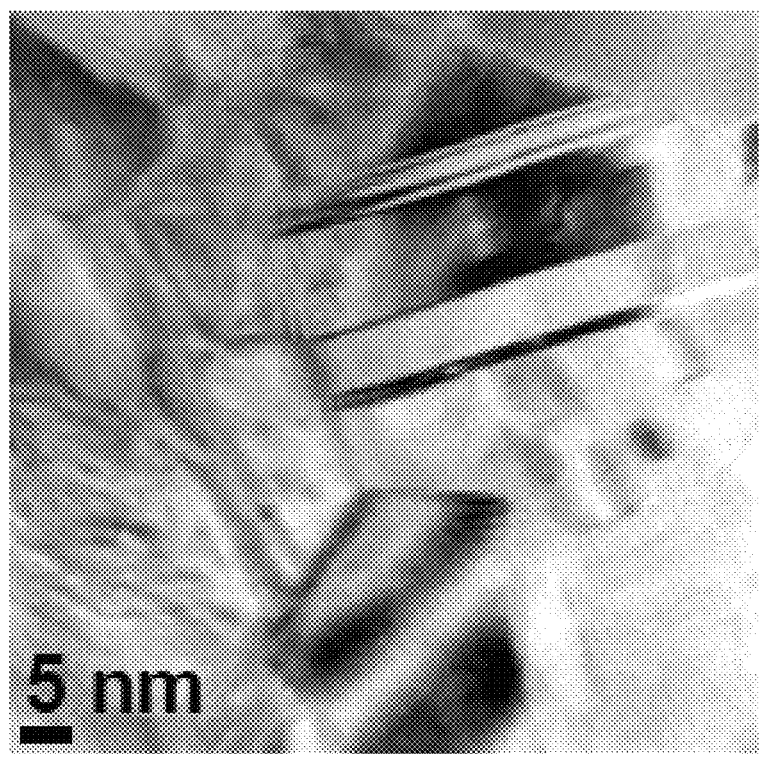
Figure 6O:
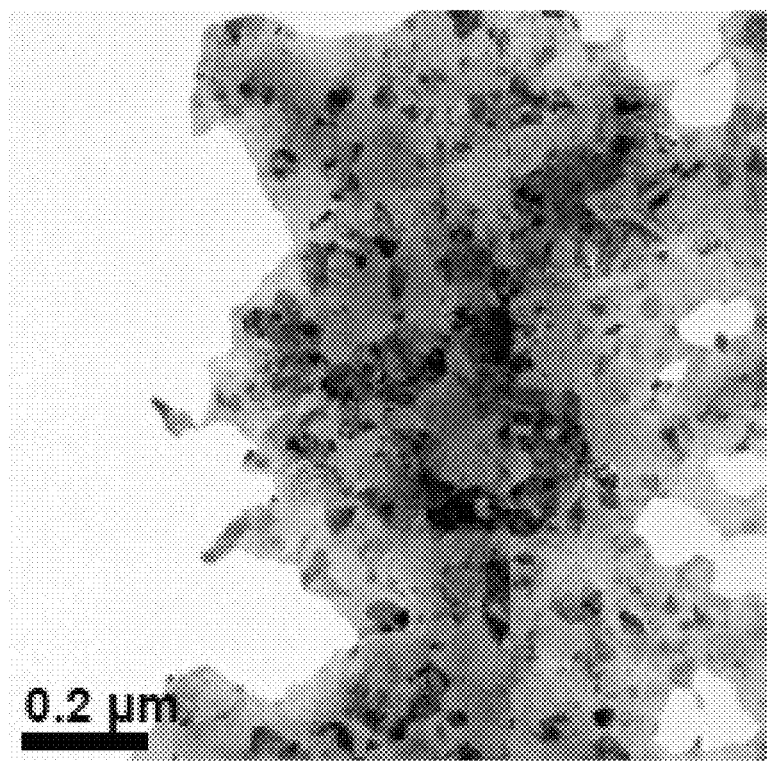
Figure 6P:
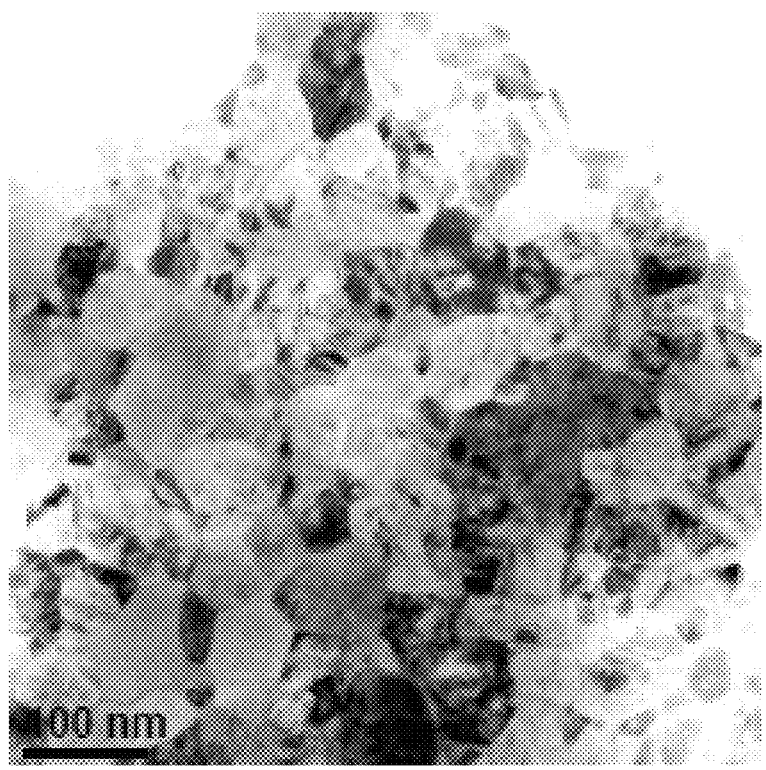
Figure 6Q:
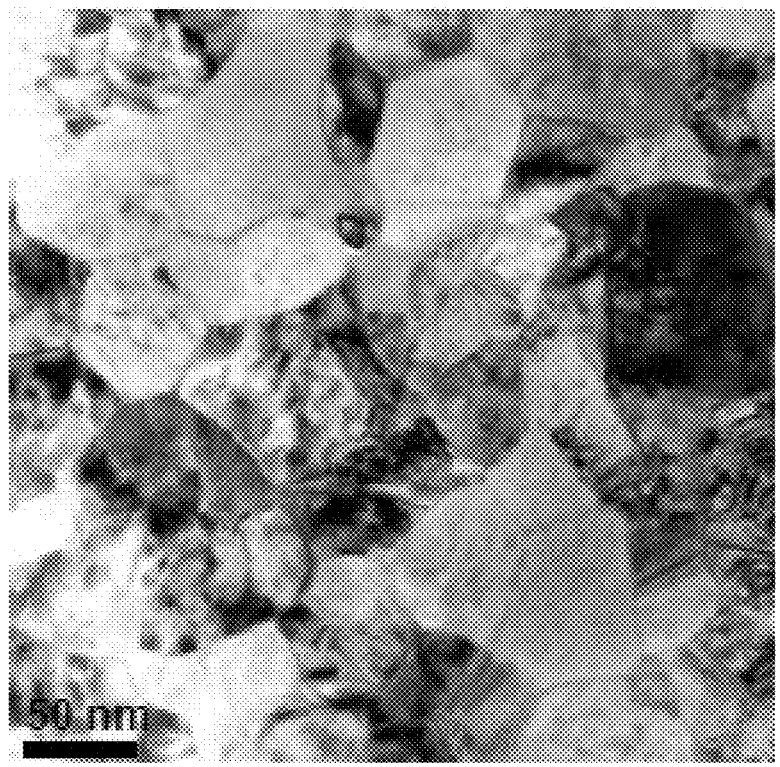
Figure 6R:
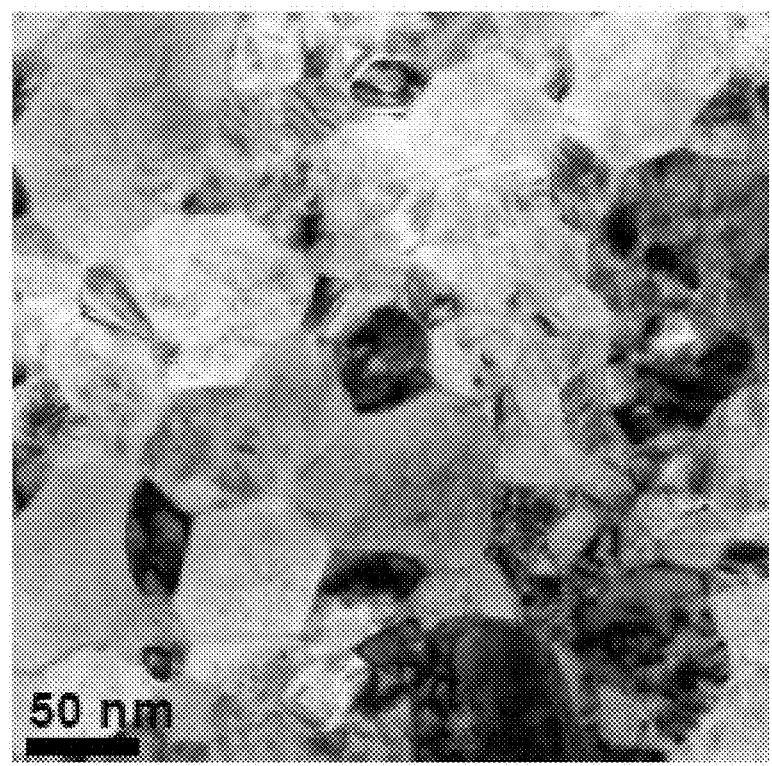
Figure 6S:
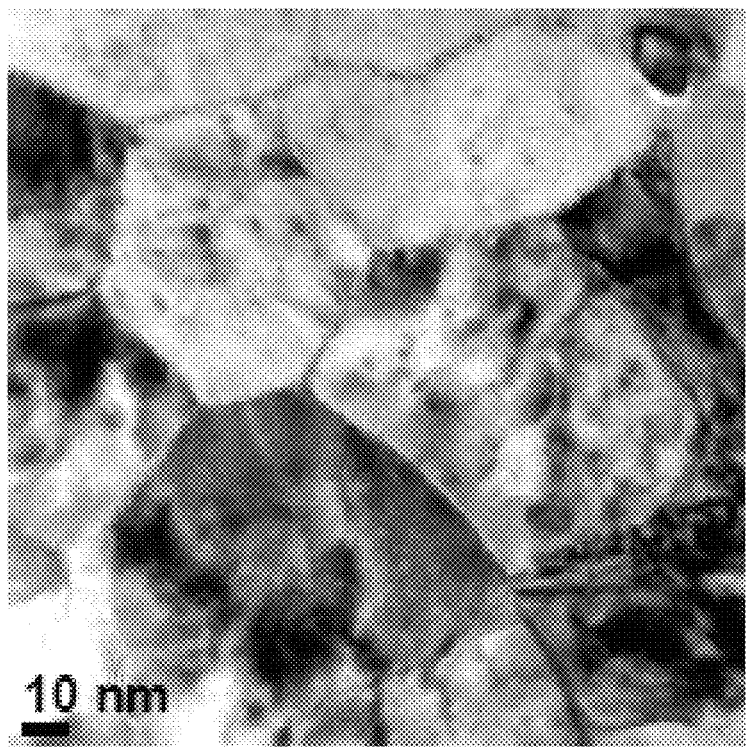
Figure 6T:
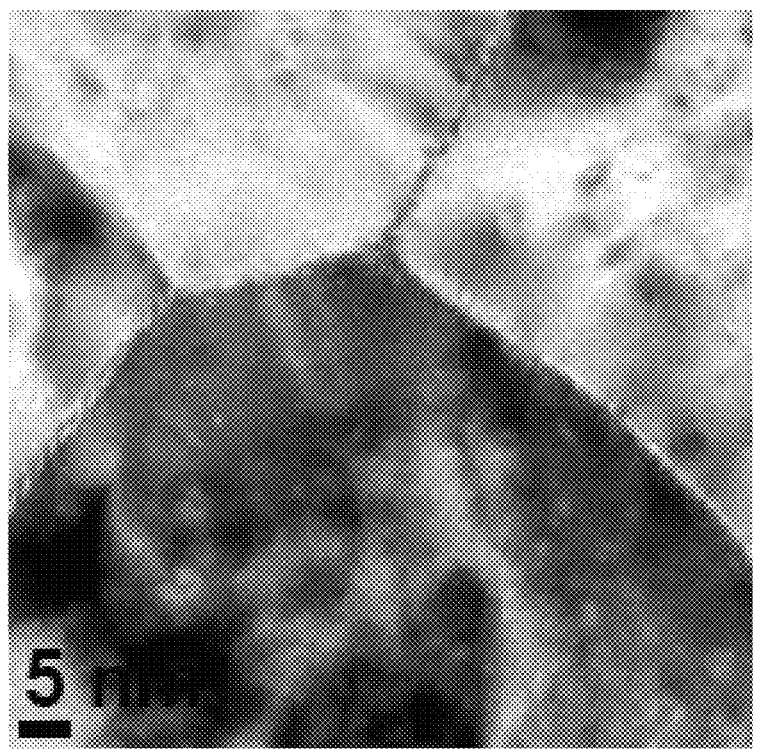

FIGS. 6A-6T show TEM images of a top view of exemplary pure nt-Ag films, and exemplary nt-Ag alloy films including a Cu solute. The exemplary films of FIGS. 6A-6T are about 3 microns to about 5 microns in thickness (measured in a direction substantially normal to any substrate on which they may be deposited), and generally are thinner than those films shown at FIGS. 4A-4C, 5A, and 5B. In particular, FIGS. 6A-6D show a top view of TEM images of pure nt-Ag crystals of a sample film, where the crystals have an average grain size of about 100 nm. FIGS. 6A-6D show the sample material at different levels of magnification, as indicated by the scales presented on the images. FIGS. 6E-6I show a top view of TEM images of nt-Ag alloy crystals of a sample film, where the crystals have an average grain size of about 50 nm. The nt-Ag alloy film includes a 0.3 at. % Cu solute in solid solution with the Ag crystals. The Cu of this sample was deposited on a silicon wafer using a magnetron sputtering apparatus configured in a confocal geometry, with the power of the gun (cathode) containing Cu set to about 20 W. FIGS. 6E-6I show sample materials at different levels of magnification, as indicated by the scales presented on the images.

FIGS. 6J-6N show a top view of TEM images of nt-Ag alloy crystals of a sample film, where the crystals have an average grain size of about 45 nm. The nt-Ag alloy film including a Cu solute in solid solution with the Ag crystals, with the Cu solute having an atomic percentage higher than the 0.3 at. % samples shown at FIGS. 6E-6I. FIGS. 6J-6N show the sample materials at different levels of magnification, as indicated by the scales presented on the images. The Cu of this sample was deposited on a silicon wafer using a magnetron sputtering apparatus configured in a confocal geometry, with the power of the gun (cathode) containing Cu set to about 40 W. FIGS. 6O-6T show a top view of TEM images of nt-Ag alloy crystals of a sample film, where the crystals have an average grain size of about 45 nm. The nt-Ag alloy film includes a Cu solute in solid solution with Ag crystals. The nt-Ag alloy films of these samples have an atomic percentage of Cu higher than those of FIGS. 6J-6N. FIGS. 6O-6T show the sample materials at different levels of magnification, as indicated by the scales presented on the images. The Cu of this sample was deposited on a silicon wafer using a magnetron sputtering apparatus configured in a confocal geometry, with the power of the gun (cathode) containing Cu set to about 60 W.

As shown in FIGS. 6E to 6T, the average size of nt-Ag crystals in solid solution with a solute (e.g., Cu) may be between about 30 nm and about 350 nm in diameter, for example, between about 45 nm and about 50 nm in diameter. The TEM images of FIGS. 6E to 6T show, among other things, that no Cu-rich phase has formed in the exemplary nt-Ag alloy films. Further, the nanotwinned Ag crystals of films including a solute in solid solution with the Ag crystals (e.g., Cu) may have smaller average grain sizes than pure nt-Ag crystal films, which may contribute to enhanced mechanical properties (e.g., strength). Moreover, variation in the rate of deposition of a solute (e.g., differing powers of a gun of a magnetron sputtering device containing the solute) may cause a variation in grain size of a nt-Ag alloy film, as shown by FIGS. 6E-6T.

Figure 7A:
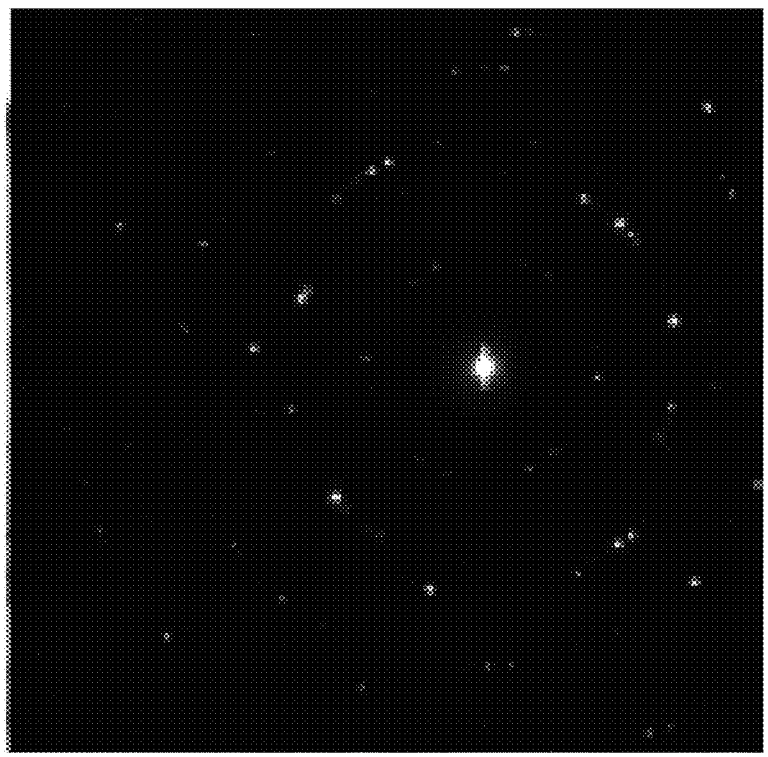
FIGS. 7A-7C show selected area diffraction patterns of exemplary pure nt-Ag and nt-Ag alloy films.
Figure 7B:
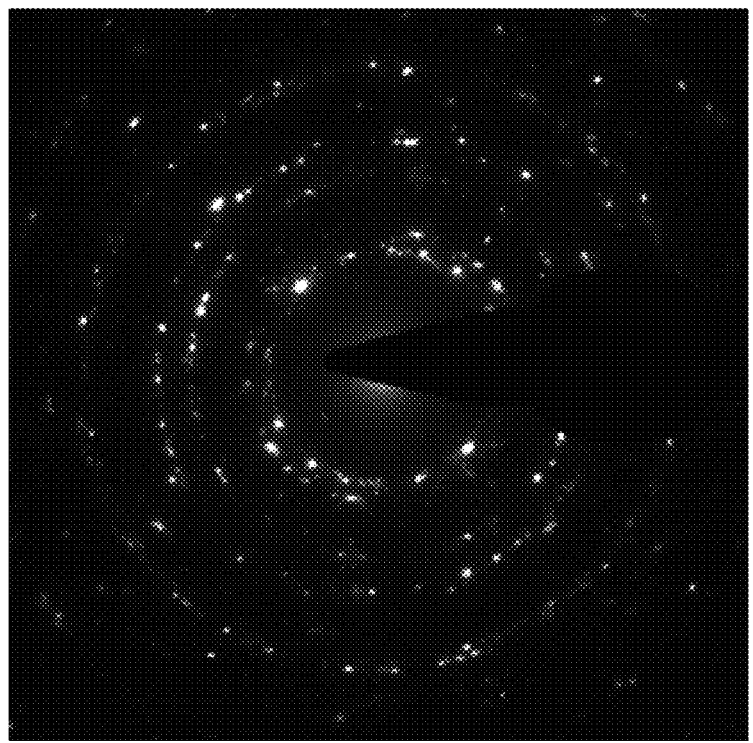
Figure 7C:
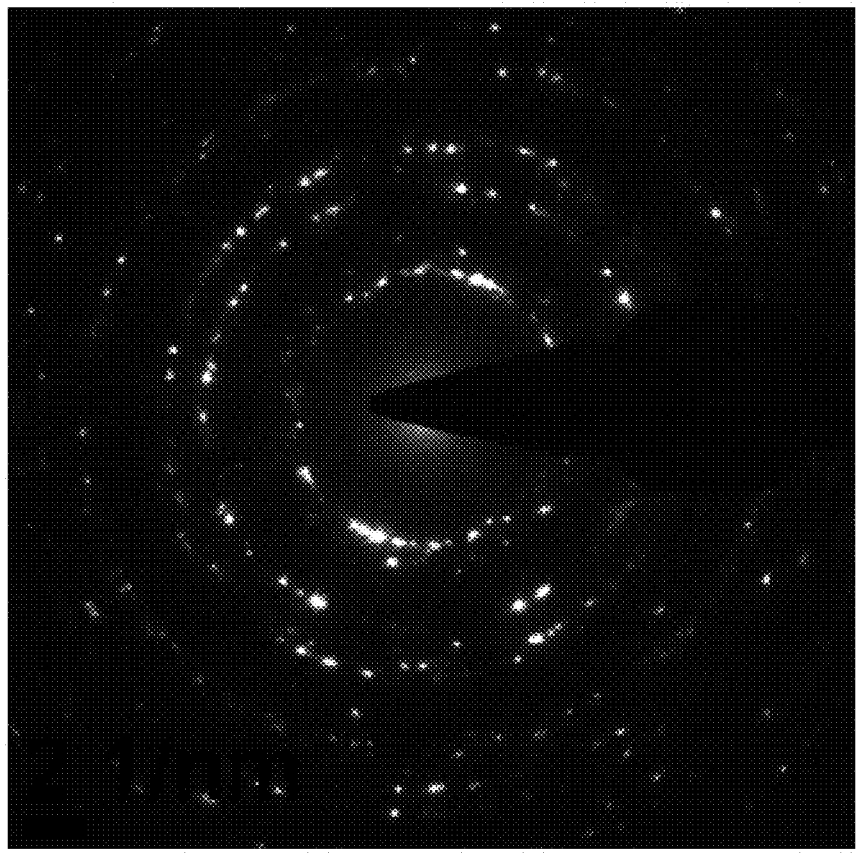

FIGS. 7A-7C show selected area diffraction patterns of exemplary pure nt-Ag and nt-Ag alloy films. FIG. 7A shows a selected area diffraction pattern of the sample pure nt-Ag film shown in FIGS. 6A-6D. The pattern confirms, among other things, the presence of an fcc Ag phase in the material. FIG. 7B shows a selected area diffraction pattern of a sample nt-Ag alloy film including 0.3 at. % Cu. The diffraction pattern of FIG. 7B corresponds to the nt-Ag alloy film shown at FIGS. 6E-6I. The pattern of FIG. 7B confirms, among other things, the absence of a Cu-rich phase in the material. The Cu of this sample was deposited on a silicon wafer using a magnetron sputtering apparatus configured in a confocal geometry, with the power of the gun (cathode) containing Cu set to about 20 W. FIG. 7C shows a selected area diffraction pattern of a sample nt-Ag alloy film including a higher atomic percentage of copper than the 0.3 at. % Cu sample of FIG. 7B. The diffraction pattern of FIG. 7C corresponds to the nt-Ag alloy film shown at FIGS. 6J-6N. The pattern of FIG. 7C confirms, among other things, the absence of a Cu-rich phase in the material. The Cu of this sample was deposited on a silicon wafer using a magnetron sputtering apparatus configured in a confocal geometry, with the power of the gun (cathode) containing Cu set to about 40 W.

Figure 8A:
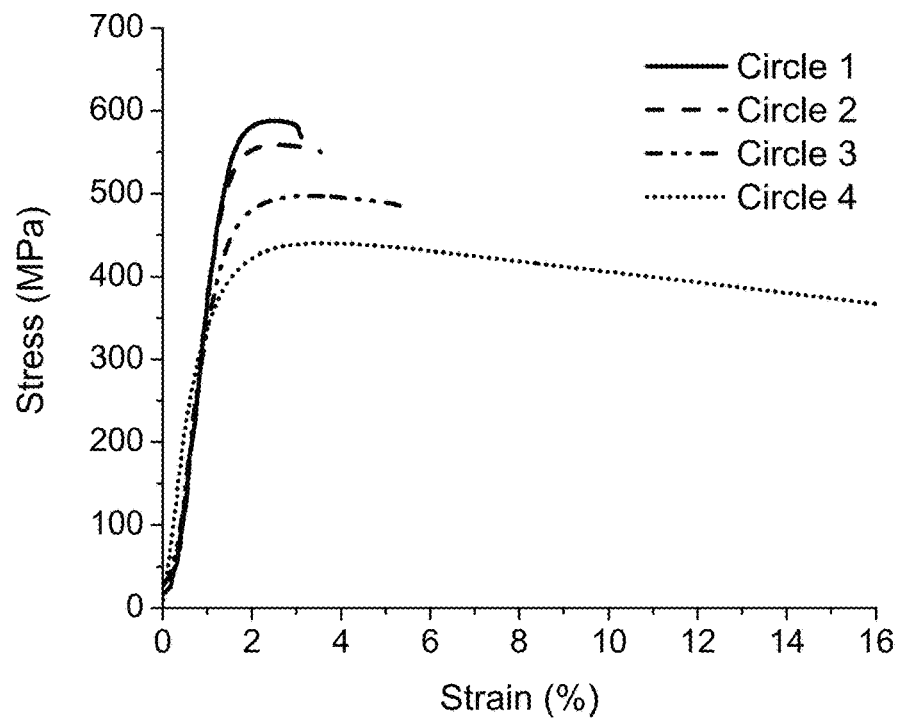
FIG. 8A is a plot of representative uniaxial tensile stress-strain curves of an exemplary pure nt-Ag film on a substrate, measured along four radial distances from the center of the substrate.

FIG. 8A is a chart presenting representative uniaxial tensile stress-strain curves (quasi-static) of an exemplary pure nt-Ag film on a substrate, measured at four radial distances from the center of the substrate. In particular, the percentage of tensile strain of a portion of the first sample film was measured at points C1 to C4 on a silicon wafer. As noted above at FIG. 1, C1 to C4 are radial distances of about 16 mm, 22 mm, 37 mm, and 49 mm from the center point of the wafer. The percentage tensile strain, as compared to the original length of the tested portion of the film, is presented on the x-axis of FIG. 8A, while the applied stress, in mega-Pascals (MPa), is presented on the y-axis. Although the displayed x-axis of FIG. 8A ends at 16% strain, the portion of the film tested at C4 had not fractured at that point.

Figure 8B:
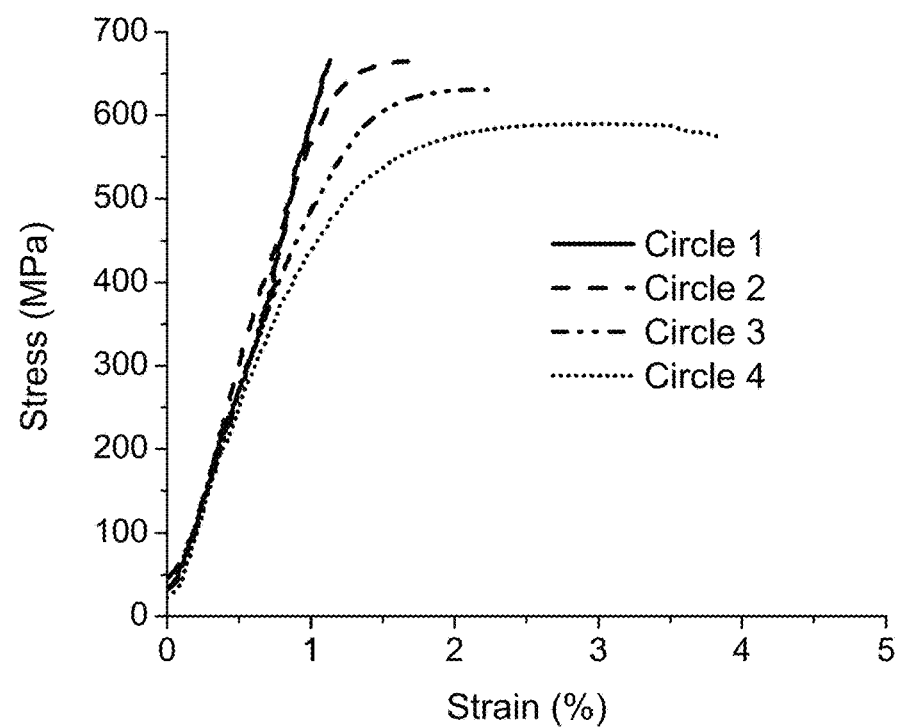
FIG. 8B is a plot of uniaxial tensile stress-strain curves of an exemplary nt-Ag alloy film including a 0.3 at. % Cu solute, measured along four radial distances from the center of the substrate.

FIG. 8B is a chart presenting uniaxial tensile stress-strain curves (quasi-static) of an exemplary nt-Ag alloy film including a 0.3 at. % Cu solute, also measured along four radial distances from the center of the substrate, i.e., C1 to C4. The film of FIG. 8B was measured at approximately the same points on the wafer as the pure nt-Ag film. As with respect to the chart of FIG. 8A, the percentage tensile strain, as compared to the original length of the tested portion, is presented on the x-axis of FIG. 8B, while the applied stress, in mega-Pascals (MPa), is presented on the y-axis. The results of FIG. 8B, as compared to those of FIG. 8A, further show that addition of a solute, e.g., Cu, may enhance the strength and may decrease the ductility of a nanotwinned Ag film, as compared to a pure nanotwinned Ag film. For example, nt-Ag alloy films of this disclosure have been measured to exhibit strengths greater than 500 MPa under quasi-static uniaxial tension, as shown at FIG. 8B. Addition of a solute, such as Cu, may enhance the strength of a nt-Ag film by about 30%, as compared to a nt-Ag film without addition of a solute. Further, nt-Ag alloy films of this disclosure may exhibit a uniaxial tensile flow stress of about 650 MPa. Exemplary nt-Ag alloy films also have been observed to display desirable transport properties (e.g., electrical conductivity), as compared to coarse-grained metal films. Likewise, nt-Ag alloy films as described in this disclosure display thermal stability at temperatures of, for example, about 400° C. Properties of continuous nanot-winned Ag alloy films (e.g., Ag in solid solution with one or more solutes), as described in this disclosure, can be tailored in a single deposition run (e.g., magnetron sputtering or electrodeposition), with such films being deposited in a range of, for example, 0.010 to 200 microns in thickness on six-inch wafer substrates, the thickness of the films being measured in a direction substantially normal to the substrate on which the films may be deposited. Films possessing such properties may be well suited for electronics applications, for example, flexible displays interconnects, where high film conductivity may be required, along with high film strength to prevent, for instance, premature failure due to repeated mechanical loading. Various examples have been described. These and other examples are within the scope of the following claims.

The invention claimed is:

1. A method comprising:
   cooling a substrate; and
   co-depositing silver (Ag) and a solute on the cooled substrate using sputtering at a rate of deposition greater than about 1.5 nm/s to form a material comprising a plurality of Ag crystals in solid solution with the solute,
   wherein a twinned boundary between at least two Ag crystals has a spacing of between about 3 and about 70 nanometers (nm), and
   wherein the solute is at least about 0.3 atomic percent (at. %) of the material, and less than about 10 at. % of the material.

2. The method of claim 1, wherein cooling the substrate comprises exposing the substrate to liquid nitrogen for at least about 30 minutes.

3. The method of claim 1, wherein the Ag and the solute are magnetron sputtered on to the substrate for about 2 hours.

4. The method of claim 3, wherein Ag and the solute are magnetron sputtered with a plurality of cathodes of a magnetron sputtering apparatus in a confocal geometry.

5. The method of claim 1, wherein a first rate of deposition of Ag and a second rate of deposition of the solute each decreases when measured in a radial direction from the center of the substrate.

6. The method of claim 1, wherein a rate of formation of the material on the substrate varies depending on the radial distance from the center of the substrate.

7. The method of claim 1, wherein the material comprises at least a face-centered cubic (fcc) Ag phase and a non-fcc Ag phase.

8. The method of claim 7, wherein the volume fraction of the non-fcc Ag phase in the material varies depending on the radial distance from the center of the substrate.

9. The method of claim 7, wherein the non-fcc Ag phase comprises a 4-hexagonal Ag phase.

10. The method of claim 1, further comprising rotating the substrate while co-depositing Ag and the solute on the substrate.

11. The method of claim 1, wherein the substrate is selected from the group consisting of silicon, amorphous carbon, steel, tantalum, copper, ceramic, glass, and polymers.

12. The method of claim 1, wherein the solute comprises at least one of copper, iron, palladium, gold, or aluminum.

* * * * *

UNITED STATES PATENT AND TRADEMARK OFFICE
CERTIFICATE OF CORRECTION

PATENT NO. : 10,196,734 B2
APPLICATION NO. : 14/664342
DATED : February 5, 2019
INVENTOR(S) : Ryan Timothy Ott and Matthew Frank Besser Page 1 of 1

It is certified that error appears in the above-identified patent and that said Letters Patent is hereby corrected as shown below:

In the Specification

Under: STATEMENT OF GOVERNMENT INTEREST

Column 1, Lines 12-16, Replace, "This invention was made with Government support from a grant under Contract No. DE-AC02-07CH11358, provided by the U.S. Department of Energy, Office of Basic Energy Sciences, Division of Materials Sciences and Engineering. The Government may have certain rights in the invention."
With, --This invention was made with Government support under Grant No. DE-AC02-07CH11358 awarded by the US Department of Energy (DOE). The Government has certain rights in the invention.--

Signed and Sealed this
Thirty-first Day of March, 2020

Andrei Iancu
*Director of the United States Patent and Trademark Office*